US006603989B1

(12) United States Patent
Yablonskiy

(10) Patent No.: US 6,603,989 B1
(45) Date of Patent: Aug. 5, 2003

(54) T2 CONTRAST IN MAGNETIC RESONANCE IMAGING WITH GRADIENT ECHOES

(76) Inventor: Dmitriy A. Yablonskiy, 118 Stoneyside La., Olivette, MO (US) 63132

( * ) Notice: Subject to any disclaimer, the term of this patent is extended or adjusted under 35 U.S.C. 154(b) by 219 days.

(21) Appl. No.: 09/704,285

(22) Filed: Nov. 1, 2000

Related U.S. Application Data

(60) Provisional application No. 60/190,994, filed on Mar. 21, 2000.

(51) Int. Cl.$^7$ ................................................. A61B 5/05
(52) U.S. Cl. ..................................................... 600/410
(58) Field of Search ............................... 600/410, 407, 600/408, 409, 411; 324/307, 308, 301; 436/173; 606/2, 20, 27, 32

(56) References Cited

U.S. PATENT DOCUMENTS

| 5,245,282 A | | 9/1993 | Mugler, III et al. | ........ 324/309 |
| 5,438,992 A | * | 8/1995 | Siegel, Jr. et al. | .......... 600/419 |
| 5,732,701 A | * | 3/1998 | Yoshitome et al. | .......... 600/410 |
| 5,917,323 A | * | 6/1999 | Du et al. | ..................... 324/309 |
| 5,995,863 A | * | 11/1999 | Farace et al. | ................ 600/410 |
| 6,066,950 A | * | 5/2000 | Tsukamoto et al. | .......... 324/309 |
| 6,127,825 A | * | 10/2000 | Goto | ............................. 324/307 |
| 6,188,219 B1 | * | 2/2001 | Reeder et al. | ............... 324/307 |
| 6,285,187 B1 | * | 9/2001 | Mock | ............................ 324/309 |
| 6,512,372 B1 | * | 1/2003 | Ikezaki | ....................... 324/312 |

OTHER PUBLICATIONS

Yablonskiy, DA; Haacke, EM, "Theory of NMR Signal Behavior in Magnetically Inhomogeneous Tissues: The Static Dephasing Regime", *MRM* 32:749–763, 1994.

Yablonskiy, DA, "Quantitative T2 Contrast with Gradient Echoes", Departments of Radiology and Physics, Washington University, St. Louis, MO, USA.

Hennig, J, Nauerth A, Friedburg H., "RARE Imaging: A Fast Imaging Method for Clinical MR", *Magnetic Resonance in Medicine 3*, 823–833 (1986).

Poon, CS; Henkelman, RM, "Practical T2 Quantitation for Clinical Applications", *JMRI* 1992; 2:541–553.

Crooks, L; Arakawa, M; Watts, J; McRee R; Kaufman, L; David PL; Margulis, AR; DeGroot, J; "Nuclear Magnetic Resonance Whole–Body Imager Operating at 3.5KGauss" *Radiology* 143: 169–174, Apr. 1982.

Yablonskiy, DA, "Quantitation of Intrinsic Magnetic Susceptibility–Related Effects in a Tissue Matrix. Phantom Study", *Magnetic Resonance in Medicine 39:417–428* (1998).

* cited by examiner

Primary Examiner—Daniel Robinson
(74) Attorney, Agent, or Firm—Ziolkowski Patent Solutions Group, LLC

(57) ABSTRACT

A method and apparatus for acquiring MR images is disclosed. The technique allows rapid acquisition of T2 weighted MR images using gradient echo imaging, and also allows the acquisition of T1 weighted or spin density images, T2* or T2' weighted images all from the same data set. The technique includes determining a nonlinear function of gradient echo time to offset magnetic field inhomogeneities and acquiring multiple sets of MR data from a series of read-out gradient pulses in a pulse sequence. Both 2-D and 3-D pulse sequence embodiments are disclosed. The MR data is then fit to an equation that includes the nonlinear function and the images are reconstructed that include T1 or spin density weighting, T2 weighting images, T2*, or T2' weighting. The resulting images are naturally co-registered.

30 Claims, 4 Drawing Sheets

T2 CONTRAST IN MAGNETIC RESONANCE IMAGING WITH GRADIENT ECHOES

CROSS-REFERENCE TO RELATED APPLICATION

This application claims the benefit of prior U.S. Provisional Application Ser. No. 60/190,994, filed Mar. 21, 2000 and entitled T2 Contrast in Magnetic Resonance Imaging with Gradient Echoes.

BACKGROUND OF THE INVENTION

The present invention relates generally to the field of Magnetic Resonance Imaging (MRI) and Magnetic Resonance Spectroscopy (MRS), and more particularly, to a method and apparatus for gradient echo MR imaging to measure a T2 relaxation rate constant and/or to create T2 contrast images together with T1 or spin density and T2* weighted images, all from the same MR data set.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

One of the problems with acquiring T2 weighted images is that conventional techniques require a relatively long repetition time (TR) in order to achieve a pure T2 (proton density) image contrast. In other words, T2 weighted imaging is generally associated with long imaging times, as compared to T1 weighted imaging. T1 imaging is much faster since such imaging is achieved by shortening the repetition time.

Measuring T2 relaxation time in MRI or MRS, as well as creating T2 contrast in MRI typically requires use of a version of spin echo (SE) pulse sequences. These sequences can differ in how signal excitation, phase encoding, and acquisition are combined together to form a pulse sequence. Different pulse sequences result in different image acquisition times, signal-to-noise (SNR) ratios and image contrasts. The most frequently used sequences for clinical diagnostic applications are traditional multi-slice two-dimensional Fourier Transform SE sequences and single-slice fast spin echo sequence techniques such as the Rapid Acquisition Relaxation Enhanced (RARE) sequence which is described by J. Hennig et al. in an article in *Magnetic Resonance in Medicine* 3,823–833 (1986) entitled "RARE Imaging: A Fast Imaging Method for Clinical MR." The former usually requires long acquisition times, on the order of minutes, and the latter represents a fast imaging approach where only a single slice can be acquired in a subsecond time scale. The common attribute of all SE techniques is the presence of refocusing RF pulses. Most often, 180° RF pulses are used. The major reason to use SE techniques stems from the refocusing nature of the 180° RF pulses, which substantially reduces the influence of unwanted magnetic field inhomogeneities on MRI signals. These approaches can suffer from motion artifacts and imperfections in slice profiles resulting from the presence of the 180° refocusing pulses. More importantly, however, SE techniques suffer from restrictions on RF power deposition. This factor substantially limits the clinical application of these techniques for high-field MR imaging.

It would therefore be desirable to have a method and apparatus capable of creating T2 contrast images using gradient echo imaging to acquire T2 contrast images in a time that approximates T1 imaging. It would also be advantageous to be able to use the same MR data that is used to construct the T2 weighted images to construct T1 or spin density images, and T2* weighted images.

SUMMARY OF THE INVENTION

The present invention provides a method of measuring T2 relaxation time constant in MRS and MRI, and creates T2 image contrast in MRI using gradient echo imaging that solves the aforementioned problems. In accordance with the present invention, the influence of magnetic field inhomogeneities on MRI signals can be removed by making use of a unique signal post-processing procedure in combination with a specially designed MRI pulse sequence without the use of refocusing RF pulses.

This technique is based on multi-gradient-echo approach and allows obtaining a T2 contrast images in MRI without using any type of SE techniques. Through use of the present invention, both T2 and T1 or spin density contrast images can be obtained in a single scan by adjusting flip angle and repetition time (TR). Further, images corresponding to long gradient echo times in a multi-gradient-echo train can be used to form T2* contrast. Therefore, this technique allows obtaining T2, T1 or spin density, and T2* weighted images in a single scan. All such images will also be naturally co-registered which is particularly advantageous for certain clinical applications.

The present invention can be implemented using either two dimensional or three dimensional pulse sequencing and since relatively low flip angles are used, the present invention requires substantially less RF power than SE acquisition techniques. The low flip angles also provide improved slice profiles as compared to traditional SE acquisition techniques. The present technique allows for fast imaging with repetition times (TR) on the order of 25 msec. on a typical clinical scanner, which promotes breath-held scanning to reduce motion artifacts. A half-Fourier approach can also be applied to increase the speed of the acquisition further.

Application of the present invention provides images that are largely insensitive to RF field inhomogeneities and also allows separation of water and lipid contributions in an image. A magnetization preparation block can also be used to suppress lipid or CSF signals, or to enhance T1 contrast.

A method of acquiring MR images, according to the present invention, includes determining a nonlinear function of gradient echo time to offset magnetic field inhomogeneities. Multiple sets of MR data are acquired from a series of read-out gradients in a pulse sequence. The invention also includes fitting the MR data to an equation that includes the nonlinear function, and then creating T1 or spin density images, and T2 images using the results of the fitting step. The invention can also be used to create T2* images using the same data set.

In accordance with another aspect of the invention, an MRI apparatus is disclosed to rapidly acquire T2 weighted images that includes a magnetic resonance imaging (MRI) system having a plurality of gradient coils positioned about a bore of a magnet to impress a polarizing magnetic field. An RF transceiver system and an RF switch are controlled by a pulse module to transmit and receive RF signals to and from an RF coil assembly to acquire the MR images. The MRI apparatus also has a computer programmed to acquire multiple sets of MR data from a series of read-out gradient pulses in a pulse sequence and determine signal intensity for each MR data. The computer then fits the MR data to a signal magnitude equation that includes a nonlinear function, and then reconstructs T2 weighted MR images that are substantially free of magnetic field inhomogeneities.

In order to reconstruct the T2 weighted images, the method includes a computer program for use with an MRI apparatus that includes instructions which, when executed by a computer, cause the computer to apply a pulse sequence with a train of gradient read-out pulses and acquire MR data during the train of gradient read-out pulses. The program determines a nonlinear function of gradient echo time based on the object scanned and the physical characteristics of the MR apparatus. The program then fits signal magnitudes of the MR data to a signal magnitude equation and reconstructs MR images using the results of the fit wherein the MR images reconstructed can include not only T2 weighted images, but also T1 or spin density images. T2* images can optionally be reconstructed using the same data set.

Various other features, objects and advantages of the present invention will be made apparent from the following detailed description and the drawings.

BRIEF DESCRIPTION OF THE DRAWINGS

The drawings illustrate one embodiment presently contemplated for carrying out the invention.

In the drawings.

DETAILED DESCRIPTION OF THE PREFERRED EMBODIMENT

Figure 1:
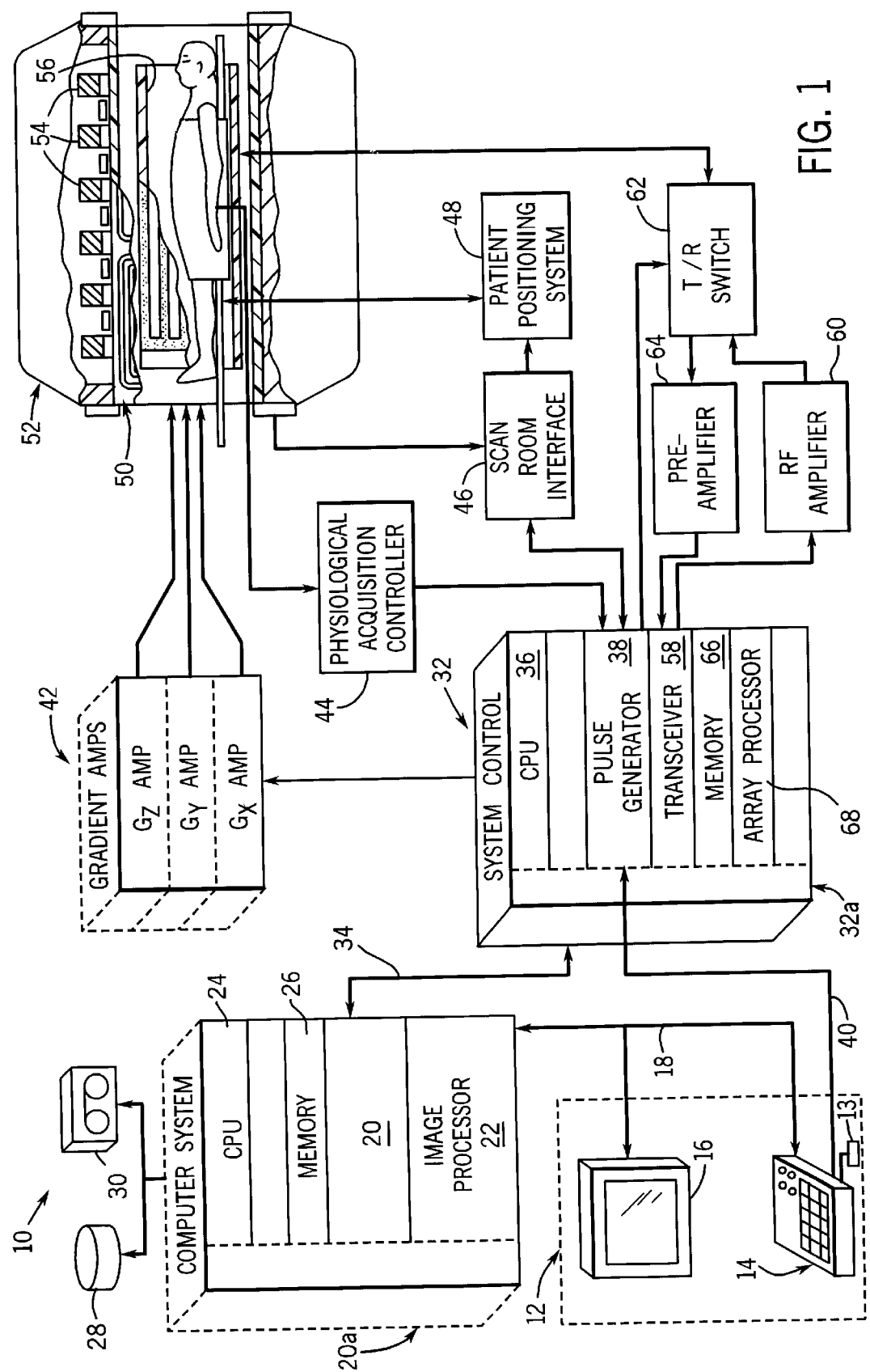
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention can be implemented in such an MRI scanner. In general, the magnet generates homogeneous magnetic field B0 in a space where the imaged subject or object is positioned. The field B0 polarizes spins of the protons and other nuclei that are present in the subject's body and creates longitudinal nuclear magnetization. The gradient coils and the generator create fast switching field gradients (G) which is an additional magnetic field along the direct of B0 with the amplitude changing linearly. The RF coils and RF generator transmit electromagnetic energy with frequencies in the range of the magnetic resonance frequencies corresponding to the applied magnetic field. The RF coils and RF receiver receive electromagnetic energy with frequencies in the range of the magnetic resonance frequencies corresponding to the applied magnetic field. An analog-to-digital converter digitizes analog signals and the computer system governs the operation of the above-described hardware according to a given pulse sequence. The computer system then stores and processes digitized magnetic resonance signals according to prior developed algorithms to produce MR images. These components are standard equipment in commercially available MRI scanners.

It is known to those skilled in the art that NMR/MRI signals acquired with spin echo sequences at spin echo time $TE_{se}$, experience exponential decay that is characterized by an R2 relaxation rate constant:

$$S(TE_{se})=S(0) \cdot \exp(-R2 \cdot TE_{se}) \qquad [1]$$

The parameter R2 is the inverse of T2 and is a tissue-specific parameter that can be used to create tissue contrast and identify tissue properties. This concept prompted a broad application of spin echo (SE) techniques in diagnostic clinical applications of MRI.

Another family of relevant MRI techniques that found applications in diagnostic radiology is based on gradient echo (GRE) imaging when free induction decay (FID) signals are acquired instead of SE signals. A major disadvantage of GRE-based techniques is their susceptibility to magnetic field inhomogeneity effects that adversely affect NMR/MRI signals. Some of these effects resulting from macroscopic field inhomogeneities are not tissue specific, but arise from magnet imperfections, tissue-air interfaces, etc. Therefore, a resulting MR image may have artifacts that preclude its usefulness. Removing macroscopic field inhomogeneity effects from the MRI image is thus quite desirable.

It was traditionally assumed that after excitation, NMR/MRI signals decay with Gradient Echo time TE as a linear exponential (Lorentzian) function:

$$S(TE)=S(0) \cdot \exp(-R2^* \cdot TE) \qquad [2]$$

where R2* is a relaxation rate constant that has contributions from both tissue-specific R2 effects and adverse effects of macroscopic field inhomogeneities.

However, the general assumption that the FID signal decays, as a linear exponential as in Eqn. 2, is incorrect. This conclusion is based on the following line of consideration and as further set forth in an article published in *Magnetic Resonance in Medicine*, Vol. 39, pp. 417–428 (1998) entitled: Quantitation of Instrinsic Magnetic Susceptibility-Related Effects in a Tissue Matrix. Phantom Study by Dmitriy A. Yablonskiy (hereinafter "Yablonskiy, 1998").

In practice the magnetic field inside of an MRI scanner is always inhomogeneous. The relative scale of this inhomogeneity compared to an imaging voxel can roughly be divided into three categories: macroscopic, mesoscopic and microscopic. Macroscopic scale refers to magnetic field changes over distances that are larger than the imaging voxel. Microscopic scale refers to changes in magnetic field over distances that are comparable to atomic and molecular size; that is, over distances that are orders of magnitude smaller than the voxel size. Mesoscopic scale refers to distances that are smaller than the voxel size, but much bigger than the atomic and molecular scale.

All these inhomogeneities affect MRI signal formation. Fluctuating microscopic field inhomogeneities lead to the irreversible signal dephasing characterized by the T2=1/R2 relaxation time constant, and changes in the longitudinal magnetization characterized by the T1 relaxation time constant. Exploitation of T1 and T2 effects provide the basis for tissue identification in MRI.

Mesoscopic field inhomogeneities are tissue specific and contribute to both, tissue irreversible R2 relaxation and reversible R2' relaxation. A typical source of the mesoscopic field inhomogeneities in biological tissue is a blood vessel network or trabecular network. The present invention is directed at eliminating the influence of undesirable macroscopic effects on the desirable microscopic and mesoscopic effects.

Macroscopic field inhomogeneities arise from magnet imperfections, body-air interface, large (compared to voxel size) sinuses inside of the body, etc. These field inhomogeneities are mostly undesirable in MR imaging because they generally provide no information of physiologic or anatomic interest. Rather, they lead to such effects as signal loss in gradient-echo imaging and image distortions in both gradient-echo and spin-echo imaging.

As set forth in the aforementioned publication by Yablonskiy, 1998, FID signal decay, due to macroscopic field inhomogeneities, cannot be described as a linear exponential (Lorentzian) function as in Eqn. 2. Given this consideration, the magnitude of the FID signal can be presented as follows:

$$S(TE)=S(0) \cdot \exp(-R2 \cdot TE) \cdot F(TE) \qquad [3]$$

where F(TE) is a function of gradient echo time TE and accounts for macroscopic field inhomogeneities. This result is remarkably different from the one described by Eqn. [2], where contribution of macroscopic field inhomogeneities was incorrectly assumed to be a linear exponential (Lorentzian).

In this invention, the non-Lorentzian behavior of the MRI signal in Eqn. [3] is used to separate desirable information on R2 relaxation from the effects of macroscopic field inhomogeneities. Fitting an FID signal to the following equation:

$$S(TE_n)=\exp(c-b \cdot TE_n) \cdot F(TE_n) \qquad [4]$$

and comparing Eqns. [3] and [4], parameter b represents the R2 relaxation rate constant:

$$R2=b. \qquad [5]$$

At the same time, the expression:

$$S(0)=\exp(c) \qquad [6]$$

also follows from this fitting procedure and represents initial signal intensity not contaminated by the macroscopic field inhomogeneities. T1 or spin density weighted images can then be displayed depending on the pulse sequence parameters used, as is known.

Implementation of this fitting procedure requires knowledge of the function F(TE). The exact calculation for the function F(TE) requires prior information of the macroscopic magnetic field distribution in a voxel. However, if this information is not available, F(TE) can be approximated. Taking into consideration that F(TE) is an even function of TE and that F(0)=1, the most general solution to the problem is to expand F(TE) to a general series:

$$F(TE) = +1 + \Sigma \alpha_m \cdot TE^{2m}. \quad [7]$$

In many practical cases the phenomenological coefficients $\alpha_m$ are small and decrease rapidly with the number m. Thus, the series can often be truncated to a manageable length. For many practical cases, only the first two terms are considered important and the function F(TE) can be approximated as a first order polynomial:

$$F(TE) = 1 - \alpha_z \cdot TE^2 \quad [8]$$

or as a Gaussian function:

$$F(TE) = \exp(-\alpha \cdot TE^2), \quad [9]$$

However, other model functions can also be considered. When macroscopic magnetic field inhomogeneities arise from large (compared to an imaging voxel size) objects, located outside of the voxel, magnetic field inhomogeneities may be well described in each given voxel by means of a constant magnetic field gradient $\vec{G}$, which is different for different voxels. If that is the case, then the function F(TE) can be represented by a simple sinc-function:

$$F(TE) = \sin\left(\frac{\Delta\omega \cdot TE}{2}\right) / \left(\frac{\Delta\omega \cdot TE}{2}\right) \quad [10]$$

where $\Delta\omega = \gamma \cdot G \cdot \Delta x$ is the frequency difference across the voxel and $\Delta x$ is the voxel size in the direction of the gradient $\vec{G}$. This expression is an approximation assuming that the voxel is a rectangle in the direction of $\vec{G}$. It is noted that Eqn. [10] only depends on one phenomenological parameter, $\Delta\omega$.

If the field inhomogeneity is small enough that the argument $\Delta\omega \cdot TE/2$ remains small for all gradient echoes in the sequence train, a Gaussian approximation in Eqn.[9] is sufficient to properly account for the macroscopic field inhomogeneities. The accuracy of such an approximation may be estimated by comparing Eqn. [10] with Eqn. [9]. If the phase dispersion, $\phi$, accumulated across the voxel during the maximum dephasing time (TE max) satisfies the criterion $\phi < \pi/2$, then a simple numerical estimation shows that the maximum difference between the full expression for F(TE), Eqn. [10], and its Gaussian approximation, Eqn. [9], is only 2%. In practice, the maximal phase dispersion across a voxel can be made much smaller than $\pi/2$ by local shimming and/or reducing the voxel size. For TE max=50 msec. for example, this criterion requires that the field inhomogeneity across the voxel should be less than 5 Hz.

For static field strength of 1.5 T, this corresponds to about 0.1 ppm/voxel. With current whole body imaging systems this homogeneity can be easily achieved even for voxels as large as 1 cm×1 cm×1 cm assuming that no macroscopic air cavities are present inside of or close to the voxel.

In a more complicated case of several tissue components with different relaxation rate constants in a given voxel, the model for magnetic resonance signal magnitude is a generalization of the model for a single component in Eqn. [3] and is given by:

$$S(TE) = (\Sigma \rho_i \cdot \exp(-R2_i \cdot TE)) \cdot F(TE) \quad [11]$$

where $\rho_i$ and $R2_i$ are weighted spin densities and the R2 relaxation rate constants for the i-th component. All these parameters can be extracted from the fitting procedure if a sufficient amount of data points are available from experimental data. Hence, the present invention allows separation of tissue components without the use of a multi-spin-echo approach.

If a lipid component is present in a voxel, then the complex magnetic resonance signal should be utilized. The model for this case can also be considered as a generalization of the model for a single component in Eqn. [3] and is given by:

$$S(TE) = e^{-i \cdot \phi(TE)} \cdot (\rho_{water} \cdot e^{-R2_{water} \cdot TE} + \rho_{lipidi} \cdot e^{-i\Delta\omega \cdot TE - R2_{lipid} \cdot TE}) \cdot F(TE) \quad [12]$$

By fitting complex signals to a model in Eqn. [12], independent images of water R2 and T1 or spin density, and lipid R2 and T1 or spin density can be generated. The present invention then allows separation of water and lipid components in the image which is quite advantageous in practical clinical applications.

The structure of the FID signal envelope in Eqns. [3], [11], and [12] therefore allows separation of R2 relaxation effects from the effects of macroscopic field inhomogeneities that contaminate image information to provide a more desirable image.

The affect of mesoscopic field inhomogeneities on magnetic resonance signals can be described as:

$$F_{meso}(TE) = \exp(-\zeta \cdot f(TE/t_c)) \quad [13]$$

and is used as an additional multiplication factor in Eqns. [3], [11], and [12]. The parameter $\zeta$ in Eqn. [13] is volume fraction occupied by deoxygenated blood and $t_c$ is a characteristic time. The structure of the function f is described in detail in the aforementioned Yablonskiy reference. The R2' relaxation rate constant is $R2' = \zeta/t_c$ and R2* relaxation rate constant has contributions from both R2 and R2' relaxation rates: $R2^* = R2 + R2'$. In many cases, the factor $F_{meso}$ gives small contributions to the FID signals and generally can be ignored. However, if desirable, it can be included in the above described fitting procedure to extract information on T2', T2* images, and tissue-specific characteristics, such as blood volume and blood oxygenation level as described in the aforementioned Yablonskiy reference. On the other hand, for gradient echo times TE shorter than the characteristic time $1.5 t_c$, the contribution of mesoscopic field inhomogeneities is Gaussian. This characteristic time has been estimated to be on the order of 20–25 msec at 1.5T if the source of mesoscopic field inhomogeneities was a blood vessel network. If the magnetic resonance signal sampling is restricted to $TE < 1.5 t_c$, the influence of mesoscopic field inhomogeneities will be described by a Gaussian term in Eqn. [9] and will not influence evaluation of tissue T2 relaxation rate constant.

It is known to those skilled in the art that the presence of macroscopic field inhomogeneities—field gradients across the voxel, may result in the shift of the center of the gradient echoes and subsequent signal loss. This effect can also be included in the function F(TE) and effectively removed from the image by this fitting procedure. As noted in the aforementioned Yablonskiy reference, this signal loss is a quadratic function of the gradient echo time TE and can be approximated by one of the model functions in Eqns. [8] or [9].

Figure 2:
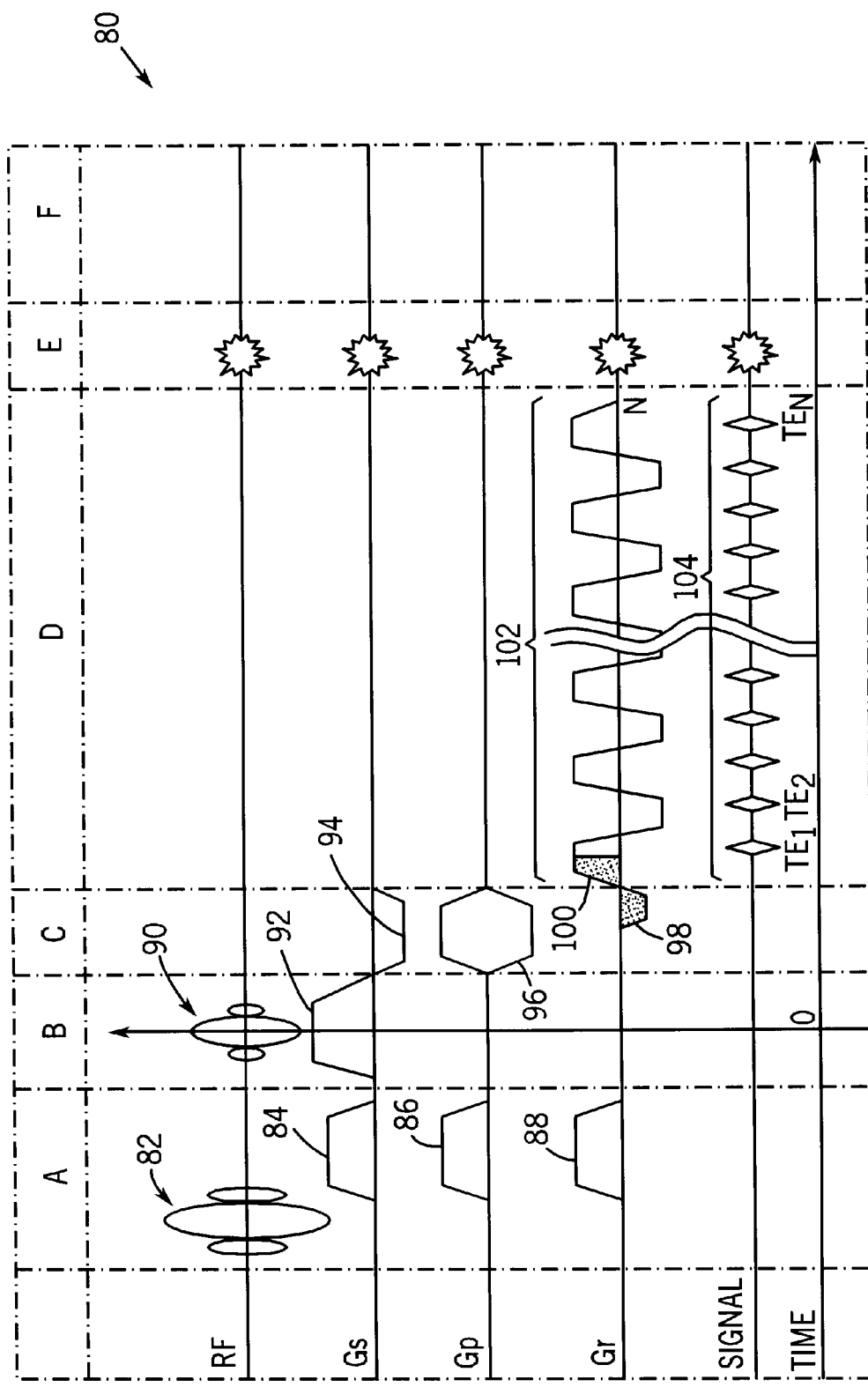
FIG. 2 is a timing diagram depicting a pulse sequence for two-dimensional multi-slice imaging in accordance with the present invention.

Referring now to FIG. 2, a two-dimensional multi-slice multi-gradient echo imaging pulse sequence is shown. The pulse sequence 80 includes a series of RF and gradient pulses designed according to FIG. 2 as described below. The pulse is produced by the MRI scanner 10 and applied by the RF receiving coils 56 and amplifiers 60, 64 to collect magnetic resonance signals. The signals are then digitized and stored in the computer memory 66 and processed according to the algorithms described herein to produce T2, T1 or spin density, and/or T2* images of the subject/object. In this particular embodiment, images are acquired as a series of two-dimensional sections (also called slices) of the subject/object.

FIG. 2 shows a pulse sequence designed to (1) encode information on the spatial distribution of the subject/object T2, T1 or spin density, and T2* properties; and (2) collect necessary magnetic resonance signals that may be reconstructed to produce T2, T1 or spin density, and T2* images of the subject/object. This pulse sequence includes Sections A–F, each designed to accomplish a certain function as described below.

Section A of FIG. 2 is an optional preparation section. It may be employed to suppress magnetic resonance signals from lipids. In this case, the RF pulse 82 is a 90° pulse with frequency centered at the lipid resonance frequency. Lipid magnetization is nutated from the longitudinal to the transverse direction. Then, gradient pulses destroy or dephase this magnetization and prevent it from contributing into the image. Those skilled in the art appreciate that this is a commonly used procedure for lipid suppression.

RF pulse 82 may also be used to suppress magnetic resonance signals from cerebral-spinal fluid (CSF). In this case, RF pulse 82 is a 180° inversion pulse with frequency centered at the CSF resonance frequency. The 180° RF pulse 82 inverts CSF magnetization from the direction parallel to B0 to the direction anti-parallel to B0. Following gradient pulses 84, 86, 88 dephase concomitant transverse magnetization that results from the imperfections in the 180° RF inversion pulse 82. RF and gradient pulses are followed by an inversion-waiting period (often called TI) calculated in such a way to null recovering longitudinal CSF magnetization and minimize its contribution to the image. Those skilled in the art appreciate that this is a commonly used procedure for CSF suppression.

The RF pulse 82 can also be used for contrast enhancement between different tissues (for example gray matter vs. white matter). In this case, RF pulse 82 is a 180° inversion pulse with frequency centered at the proton resonance frequency. An RF pulse 82 designed as such inverts tissue magnetization from the direction parallel to B0 to the direction anti-parallel to B0. Following gradient pulses 84, 86, 88 dephase concomitant transverse magnetization that results from the imperfections in the 180° RF inversion pulse 82. RF and gradient pulses follow the inversion-waiting period and are calculated in such a way as to maximize the difference between the longitudinal magnetization of tissues of interest. While the most commonly used procedures have been described, it is contemplated that other preparation operations can also be employed in this preparation section and are within the scope of the appending claims.

Section B of the pulse sequence of FIG. 2 is designed to select a section in the subject/object body that is desired to be imaged. This section includes simultaneously applying an RF pulse 90 with flip angle a and a slice-selective gradient pulse 92. Such a combination nutates tissue longitudinal magnetization in a given section from the longitudinal direction by the angle a and creates transverse magnetization that can be detected by the RF coils as a magnetic resonance signal. Those skilled in the art appreciate that this is a commonly used procedure for slice selection. Also, the phase of RF pulse 90 in Section B can be alternated in a known way to reduce certain image artifacts.

Section C includes several gradient pulses 94, 96, 98 that have several functions. A gradient pulse 94 is applied in the slice-selection direction Gs with an amplitude in the opposite direction to those in Section A to enhance magnetic resonance signals by rephasing back transverse magnetization created and dephased during the slice-selection procedure in Section A. A gradient pulse 96, with a certain amplitude and duration, is applied in the phase-encoding direction Gp (one of two orthogonal directions in the selected slice) to encode spatial information on the subject/object properties in the phase-encoding direction Gp into the magnetic resonance signals. Those skilled in the art appreciate that this is a commonly used procedure in 2D Fourier-Transform imaging.

A gradient pre-pulse 98, with a certain amplitude and duration is applied in the read-out direction Gr (second of the two orthogonal directions in the selected slice) to preliminary rephase transverse magnetization in order to define the position of the first gradient echo 100 in Section D. The first gradient echo 100 occurs at time $TE_1$ and is designed such that the shaded area under the gradient pre-pulse 98 in Section C will be equal to the shaded area under the first gradient pulse 100 in Section D. This is a commonly used procedure to define the center of the gradient echo in Fourier-Transform imaging.

Section D of the pulse sequence of FIG. 2 includes a series of N fast switching gradient pulses 102 (i.e., a gradient-pulse train) in the read-out direction Gr. Each of the gradient pulses in this train 102 is designed to form a gradient-echo 104 in the magnetic resonance signals. N gradient pulses produce N gradient echoes, wherein the N-th echo in the train occurs during the N-th gradient pulse. The center of the N-th echo corresponds to the time $TE_N$ elapsed from the center of the RF excitation pulse 90 in Section B. A total of N magnetic resonance signals, or gradient echoes 104, are collected, digitized, and stored during this period. Each digitized gradient-echo signal contains Nr points, with Nr is the image resolution in the read-out direction Gr. Because each signal is collected in the presence of the read-out gradient 102, it bears spatial information on the subject/object in the read-out direction Gr. The structure of gradient pulses 102 and the signal sampling rate can be calculated according to the general rules that are known to those who are skilled in the art. During this step, one line of 2D image k-space data along the read-out direction Gr is covered for each of the N gradient echoes 104.

Section E is designed to destroy residual transverse magnetization. Any of the standard techniques such as gradient spoiling or RF spoiling can be utilized. Those skilled in the art appreciate that these are well known and commonly used procedures.

Section F is a waiting period designed to restore longitudinal magnetization in a given slice. During this period, no RF pulses are applied to a given slice allowing recovery of the longitudinal magnetization due to the T1 relaxation processes.

To collect information necessary to reconstruct images, the pulse sequence 80 with Sections A through F is repeated Np times, where Np is the image resolution in the phase-encoding direction Gp. Those skilled in the art will appreciate that during each such repetition, the phase-encoding gradient 96 should be incremented by a certain calculated amount to achieve full coverage of the image k-space. Results of this procedure is N covered k-space data sets corresponding to N gradient echoes 104 where the N-th gradient echo is centered at the gradient echo time TEN. A two-dimensional Fourier transform of each of the k-space data sets results in N complex images for each slice at the position z:

$$\rho_n(x,y,z) \cdot \exp(-i \cdot \phi_n(x,y,z)); \ (n=1, 2, \ldots, N). \quad [14]$$

Where $\rho_n(x,y,z)$ and $\phi_n(x,y,z)$ are image intensity and phase for a slice at the position z, respectively, and x and y are image spatial coordinates in the read-out Gr and phase-encoding Gp directions. Where z=1 for a single slice acquisition.

It is known that the noise in the images can be reduced by repeatedly collecting the same line in the k-space and averaging the complex data. The waiting period in Section F can be used to collect magnetic resonance signals from other slices by subjecting them to the procedures described above in Section A–E. This collection of data is known as 2D multi-slice interleaved imaging—a procedure substantially reducing imaging time.

After N images of each slice are obtained, the data is analyzed on a pixel-by-pixel basis to produce T2 and either T1 or spin density and T2* weighted images. To do so, for each pixel (x,y) in each slice z, a data array is formed and assigned to the magnetic resonance signal as a function of time TE:

$$S(x,y,z; TE_n) = \rho_n(x,y,z) \cdot \exp(-i \cdot \phi_n(x,y,z)) \quad [15]$$

For each pixel (x,y) in each slice z, the magnitude of the signal is then fit to Eqn. [3] and images R2(x,y,z) and S(x,y,z;0) are produced according to the algorithms described in Eqns. [5], and [6]. If more complicated models, such as in Eqns. [11] and [12] are used, then R2(x,yz) and S(x,y,z;0) images may be produced for each of the compartments in the tissue. Those skilled in the art will appreciate that the image S(x,y;0) may represent either a spin-density image or a T1 weighted image depending on the relationship between the parameters used in the pulse sequence, mainly repetition time TR and flip angle α.

The gradient echo images that are collected during the positive and negative read-out gradient pulses 102 of Section D, may be distorted differently due to the presence of macroscopic field inhomogeneities. There are at least two ways to deal with this problem. One of the image correction procedures, known to those skilled in the art, can be applied to each image prior to pixel-by-pixel analysis described above, or two series of images in the echo-train (one collected in the positive gradients and another in the negative gradients) can be analyzed independently before combining in the resultant image.

If the factor described in Eqn. [13] is used in the fitting procedure to the signals in Eqn. [15], then an image, bearing information on the tissue-specific mesoscopic field inhomogeneities, R2'(x,y,z), can be produced according to the aforementioned Yablonskiy reference.

It can be further appreciated by those skilled in the art that MR images resulting from Eqn. [14] that are acquired at the end of the echo-train 104, correspond to long gradient echo times TE, are therefore T2* weighted. Hence, this new imaging technique produces T2, T1 or spin density, and/or T2* weighted images for each slice of the object/subject. Because all these images result from the analysis of the same data set, they are naturally co-registered.

Figure 3:
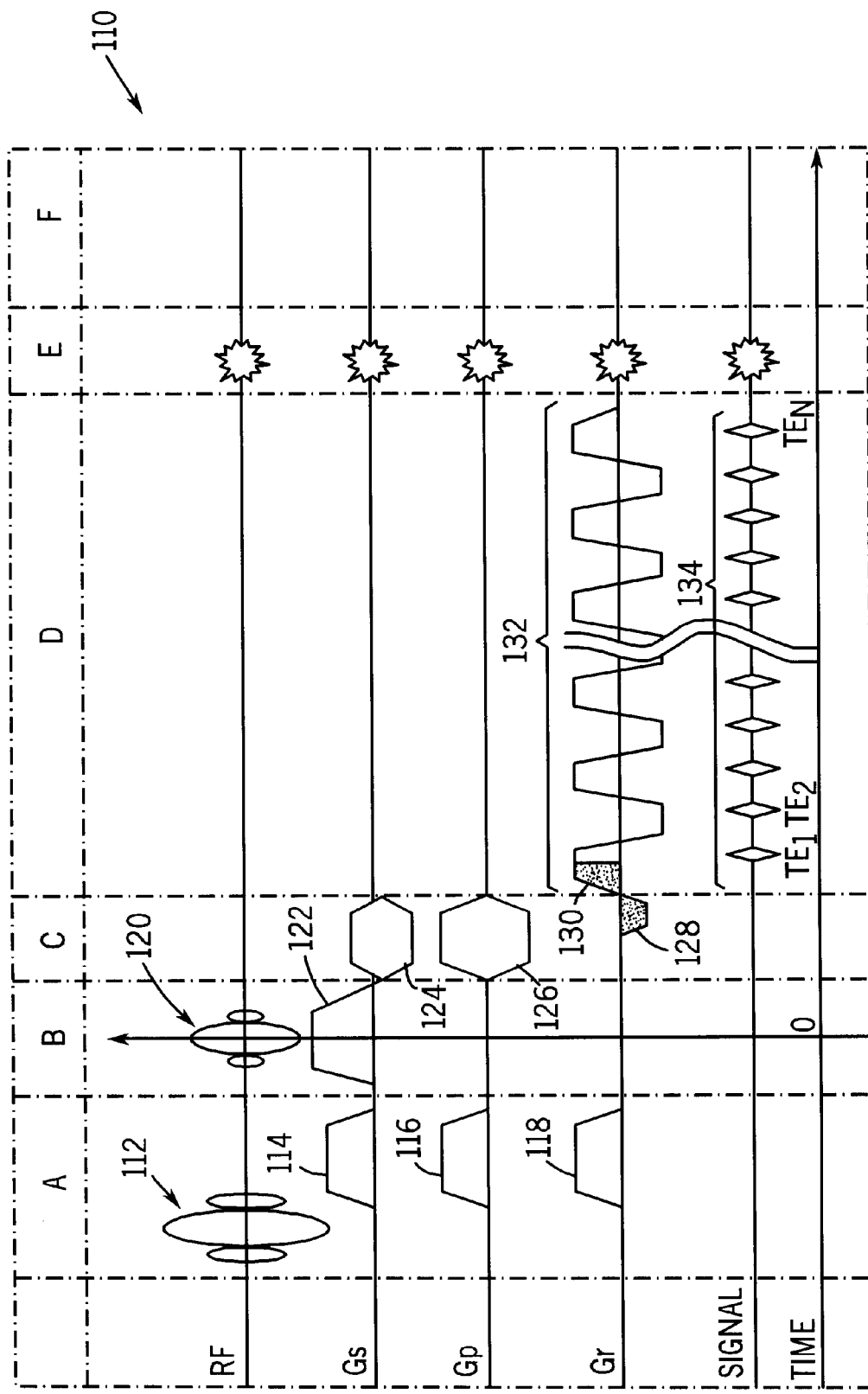
FIG. 3 is a timing diagram depicting a pulse sequence for three-dimensional imaging in accordance with the present invention.

Referring now to FIG. 3, another embodiment of the present invention is shown using a three-dimensional multi-gradient echo imaging pulse sequence 110. After a subject/object is positioned in the MRI scanner 10, a pulse sequence 110, designed according to FIG. 3 and described below, is produced by the MRI scanner 10 and applied by the RF receiving coils 56 and amplifiers 60, 64 to collect magnetic resonance signals. The signals are then digitized and stored in the computer memory 66 and processed according to the algorithms herein described to produce T2, T1 or spin density, and T2* images of the subject/object. In this embodiment, images are acquired as three-dimensional views of a thick slab from the subject/object.

FIG. 3 shows a pulse sequence 110 designed to (1) encode information on the spatial distribution of the subject/object with T2, T1 or spin density, and T2* properties; and to (2) collect necessary magnetic resonance signals that may be reconstructed to produce T2, T1 or spin density, and/or T2* images of the subject/object. The pulse sequence 110 includes six sections A–F, as in FIG. 2. As is evident, most of the 3-D pulse sequence 110 of FIG. 3 is similar to the 2-D pulse sequence 80 of FIG. 2 with similar function as described with reference to FIG. 2. For example, Section A includes an optional RF pulse 112 which can be designed similarly to that described with reference to FIG. 2. The RF pulse 112 is followed by dephasing gradients 114, 116, and 118, also as was described with reference to FIG. 2. Section B includes RF pulse 120 and a slice-selective gradient pulse 122, both of which have been described with reference to FIG. 2.

Section C of the 3-D pulse sequence 110 of FIG. 3 includes three gradient pulses 124, 126, and 128. The gradient pulse 124 is a 3-D phase encoding gradient pulse and is applied in the slab-selective direction Gs. The gradient pulse 124 is applied in a direction perpendicular to the plane of the selected slab to encode spatial information on the subject/object into the magnetic resonance signal. Simultaneously, a phase encoding gradient pulse 126 is applied in the phase encoding direction Gp and gradient prepulse 128 is applied in the read-out direction Gr. The gradient prepulse 128 is designed to preliminarily rephase transverse magnetization in order to define the position of the first gradient echo 130 of Section D which includes a series of fast switching gradient pulses 132 (i.e., the gradient pulse train). As previously described, if there are N gradient pulses in the train 132, there are N gradient echoes 134 from echo time $TE_1$ to $TE_N$. The read-out gradient pulses 132 and the gradient echoes 134 are followed by Section E which can include gradients or RF spoiling to destroy residual transverse magnetization. Also as previously described, Section F is simply a waiting period designed to restore longitudinal magnetization in a given slab.

In 3-D imaging, to collect information necessary to reconstruct images, the entire pulse sequence 110 is repeated Np×Ns times, where Np is the image resolution in the phase-encoding direction and Ns is the image resolution in the slab-selection direction. Those skilled in the art appreciate that during each such repetition, the 3D and 2D phase-encoding gradients 124, 126 should be incremented by a certain calculated amount to achieve full coverage of the 3D image k-space. The results of this procedure is N 3D k-space data sets corresponding to N gradient echoes 134 where the Nth gradient echo is centered at the gradient echo time $TE_N$. A three-dimensional Fourier transform of each of k-space data sets result in N complex 3D images:

$$\rho_n(x,y,z)\cdot\exp(-i\cdot\phi_n(x,y,z)); (n=1, 2, \ldots, N). \quad [16]$$

Where $\rho_n(x,y,z)$ and $\phi_n(x,y,z)$ are the image intensity and phase corresponding to x, y and z in the read-out, phase-encoding and slab-selection directions.

After N images are obtained, the data is analyzed on a voxel-by-voxel basis to produce T2 and T1 or spin density weighted images. To do so, for each voxel (x,y,z) a data array is formed and assigned to the magnetic resonance signal as a function of time TE:

$$S(x,y,z;TE_n)=\rho_n(x,y,z)\cdot\exp(-i\cdot\phi_n(x,y,z)). \quad [17]$$

For each voxel (x,y,z) the magnitude of the signal is then fit to Eqn. [3] and images R2(x,y,z) and S(x,y,z;0) are produced according to the algorithms described in Eqns. [5] and [6]. If more complicated models, such as in Eqns. [11] and [12] are used, then R2(x,yz) and S(x,yz;0) images may be produced for each of the compartments in the tissue. Those skilled in the art will appreciate that the image S(x,y,z;0) may represent either a spin-density image or a T1 weighted image depending on the relationship between the parameters used in the pulse sequence, mainly repetition time TR and flip angle α.

Images acquired at the end of the echo-train 134 that correspond to long gradient echo times TE are T2* weighted. Alternatively, if an additional function as in Eqn. [13] is used for data analysis, T2' images can also be produced. Accordingly, this imaging technique can produce T2, T1 or spin density, T2* or T2' weighted 3D images of the object/subject. Because all these images result from the analysis of the same data set, they are also naturally co-registered.

Figure 4:
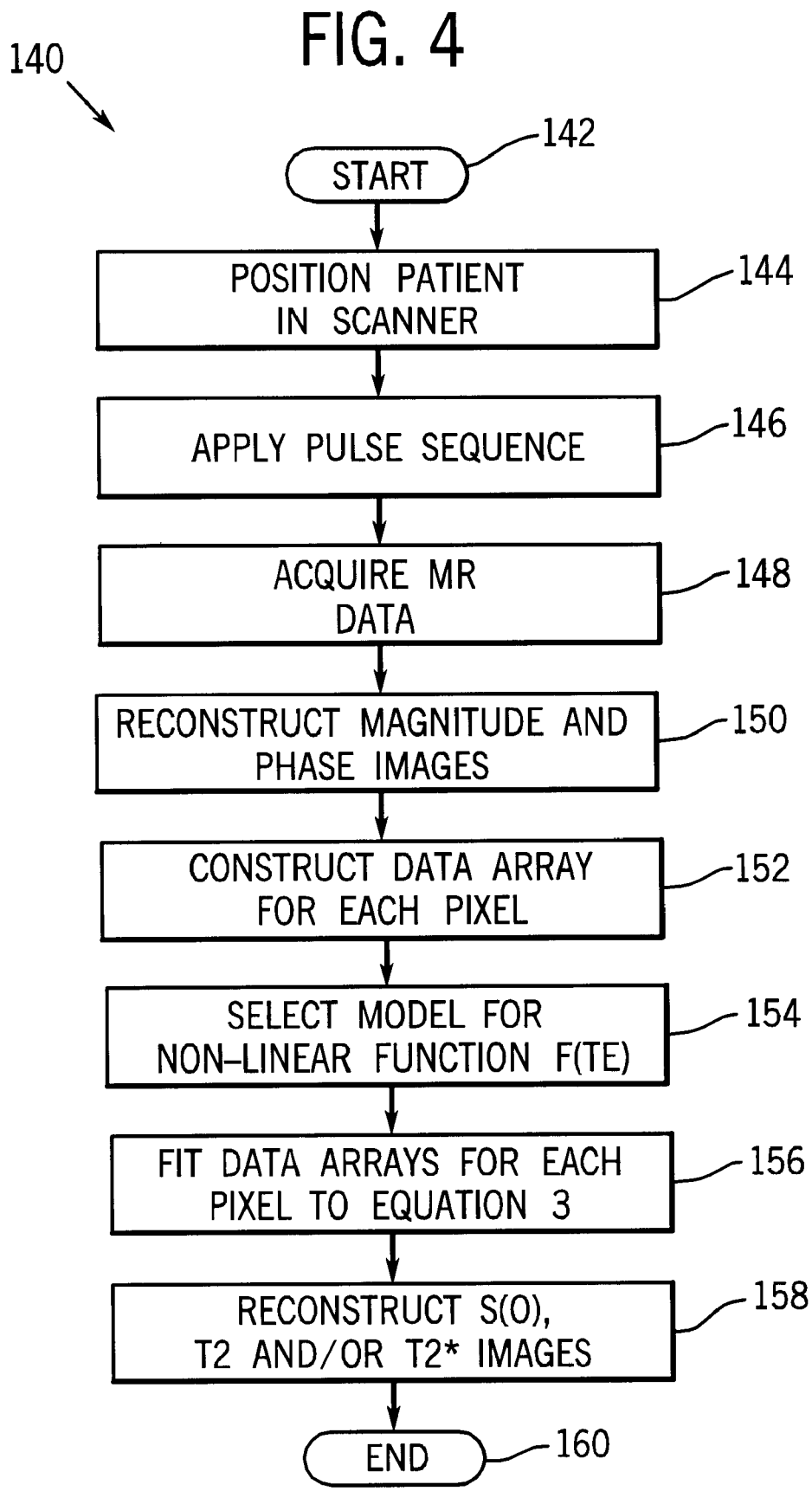
FIG. 4 is a flow chart showing an implementation of the present invention for use with the system of FIG. 1.

Referring now to FIG. 4, a flow chart of the aforementioned algorithm 140 is shown. After initialization 142 and positioning a patient in the scanner 144, the pulse sequences 146 is applied and MR data is acquired at 148. After reconstructing magnitude and phase images 150, the data arrays are constructed for each pixel 152 and the system selects a model for the nonlinear function F(TE) 154. The data arrays are then fit to Eqn. [3] 156 and the system is able to reconstruct the images S(x, y, z; 0), T2, T2*, or T2' from the same data set.

The present invention was tested using the 2-D multi-slice multi-gradient echo imaging pulse sequence of FIG. 2 on a 1.5 Tesla whole body MRI scanner without any preparation pulses. Eleven images of a $NiSO_4$ doped water phantom were acquired. The inter-echo time was 3.2 msec, TR was 40 msec with a matrix of 128×128. Acquisition time was complete in 6 seconds. R2 maps were obtained by fitting time domain data of signal intensity on a pixel by pixel basis to Eqn. [3] with Gaussian F(TE) from Eqn. [9]. The resultant R2 map was largely flat except for a pixel-size layer near the phantom surface. The average R2 was 12.7 $sec^{-1}$ with a variation of 2% which was in agreement with the R2 value of (12.6±0.1) $sec^{-1}$ obtained with a double-spin echo technique that has been a standard acquisition technique. To obtain such a map with the spin echo (SE) technique took approximately 84 seconds as compared to the 6 seconds of imaging time with the proposed method.

Further testing took place by imaging the brain of a healthy volunteer. Nine images from each slice were collected utilizing only positive read-out gradient pulses so that the first image was acquired at $TE_1$=2.742 msec followed by another eight gradient echo images separated by 3.83 msec. The Field-of-View was set at 30 cm with a matrix size was 256×256, a repetition time TR of 500 msec, and a flip angle of 80°. Ten 5-mm thick slices were acquired in an interleaved manner. One acquisition was used. Total acquisition time was 2 min. and 8 secs. Data was processed by using the model described in Eqn. [3] with the function F(TE) described in Eqn. [8]. The results were compared with images obtained with a standard Fast Spin Echo technique (RARE) from the same slices with the same geometrical parameters. Both techniques provided very similar images. However, in addition to the T2 images that were developed with the RARE technique, the present invention also produced T1 and T2* weighted images.

Accordingly, the present invention provides a new technique for measuring T2 relaxation rate constant in MRS and MRI, and creating T2 image contrast in MRI. The technique is based on multi-gradient-echo approach and allows obtaining a T2 contrast in MRI without exploitation of any SE techniques. Furthermore, it has the additional advantages of obtaining of T2, T1 or spin density, and T2* weighted images in a single scan. All these images are also naturally co-registered. As described, both 3D and multi-slice 2D versions can be implemented. This approach requires substantially less RF power compared to SE approaches and allows for fast imaging with repetition time (TR) on the order of 25 msec on a typical clinical scanner.

Although two embodiments of the invention have been described in detail, those skilled in the art will appreciate that additional modifications are possible. For example, 2D or 3D images corresponding to different gradient echo times TE can be collected by means of a spiral scanning technique instead the Fourier Transform Imaging technique discussed herein. Data may then be arranged according to Eqns. [15], and [17] and analyzed using the same algorithms as previously discussed to provide T2, T1 or spin density, T2*, or T2' weighted images.

Another alternative includes the use of signal amplitude and phase. As previously described, the function F(TE) can be evaluated by fitting experimental data to the MR signal magnitude equation. However, information on the function F(TE) can also be obtained by making use of phase images in addition to the magnitude images. As is known, both signal magnitude and phase are readily available from the complex MR signal as described in Eqns. [14–17]. More specifically, the phase images allow calculation of average magnetic field for each voxel, B(x,y,z), by fitting phase in each voxel to the equation:

$$\phi_n(x,y,z)=\phi_n(x,y,z)+\gamma\cdot B(x,y,z)\cdot TE_n. \quad [18]$$

This in turn allows evaluation of spatial distribution of the magnetic field inside of any given voxel. Therefore, the function F(TE) describing macroscopic field inhomogeneities can be calculated for each voxel as an integral over the volume of a given voxel V:

$$F(TE)=\int\exp(-i\cdot\gamma\cdot b(r')\cdot TE)dr'/V, \quad [19]$$

where γ is a gyromagnetic ratio constant and r'=(x',y',z') is a spatial coordinate in the voxel. As an example, magnetic field b(r') in a voxel may be approximated as a combination of field gradients:

$$b(r')=g_x\cdot(x'-x)+g_y\cdot(y'-y)+g_z\cdot(z'-z) \quad [20]$$

where x, y and z are coordinates of the voxel center and $g_x$, $g_y$ and $g_z$ are macroscopic field gradients across given voxel. These gradients can be estimated as follows:

$$g_x=[B(x+\Delta x,y,z)-B(x-\Delta x,y,z)]/(2\Delta x)$$
$$g_y=[B(x,y+\Delta y,z)-B(x,y-\Delta y,z)]/(2\Delta y)$$
$$g_z=[B(x,y,z+\Delta z)-B(x,y,z-\Delta z)]/(2\Delta z) \quad [21]$$

In the above equations, $\Delta x$, $\Delta y$, and $\Delta z$ are voxel dimensions in x, y and z directions, respectively. Substitution of Eqns. [21] in Eq. [20] provides an expression for nonlinear function F(TE) an expression that is a product of three sinc-function:

$$F(TE)=[\sin(\gamma\cdot g_x\cdot\Delta x\cdot TE/2)/(\gamma\cdot g_x\cdot\Delta x\cdot TE/2)]\cdot[\sin(\gamma\cdot g_y\cdot\Delta y\cdot TE/2)/(\gamma\cdot g_y\cdot\Delta y\cdot TE/2)]\cdot[\sin(\gamma\cdot g_z\cdot\Delta z\cdot TE/2)/(\gamma\cdot g_z\cdot\Delta z\cdot TE/2)]. \quad [22]$$

Therefore, only two parameters, c and b, remain unknown in Eqn. [4]. This calculation substantially increases the efficiency of the fitting algorithm and increases the signal-to-noise ratio in the final T2 and T1 images.

Accordingly, the present invention includes a method of acquiring MR images that includes acquiring multiple sets of MR data from our series of readout gradient pulses in a pulse sequence and determining a nonlinear function of gradient echo time F(TE) to offset magnetic field inhomogeneities. The method also includes fitting the MR data to an equation that includes the nonlinear function F(TE) in Eq. [3] and creating at least S(x, y, z;0) and T2(x,y,z) images using the results of the fitting step. If additional nonlinear function $F_{meso}$(TE) in Eq. [13] is used, the invention allows creating images that give information on tissue blood volume and blood oxygenation level.

The invention also includes an MRI apparatus to rapidly acquire T2 weighted MR images using gradient echo imaging that includes a magnetic resonance imaging (MRI) system having a plurality of gradient coils positioned about a bore of a magnet to impress a polarizing magnetic field. The MRI system also includes an RF transceiver system and an RF switch controlled by a pulse module to transmit RF signals to an RF coil assembly to acquire the MR images. The apparatus includes a computer programmed to acquire multiple sets of MR data from a series of read-out gradient pulses in a pulse sequence and determine signal intensity for each MR data. The computer is also programmed to fit the MR data to a signal magnitude equation that includes a nonlinear function. T2 weighted MR images are then reconstructed that are substantially free of magnetic field inhomogeneities.

The invention also includes a computer program for use with an MRI apparatus that includes instructions which, when executed by a computer, cause the computer to apply a pulse sequence with a train of gradient read-out pulses and acquire MR data during the train of gradient read-out pulses. Depending upon identification of an object scanned, the computer program also determines a nonlinear function of gradient echo time and fits signal magnitudes of the MR data to a signal magnitude equation. The program can then reconstruct MR images using results of the equation fit wherein the MR images reconstructed can include S (x,y, z;0) and T2(x,y,z) weighted images.

The present invention has been described in terms of the preferred embodiment, and it is recognized that equivalents, alternatives, and modifications, aside from those expressly stated, are possible and within the scope of the appending claims.

What is claimed is:

1. A method of acquiring MR images comprising the steps of:
   acquiring multiple sets of MR data from a series of read-out gradient pulses in a pulse sequence;
   determining a nonlinear function of gradient echo time F(TE) to offset magnetic field inhomogeneities;
   fitting the MR data to an equation that includes the nonlinear function F(TE); and
   creating S(0) and T2 images using the results of the fitting step.

2. The method of claim 1 further comprising the step of creating a T2* image based on the same MR data used to create the S(0) and T2 images.

3. The method of claim 1 further comprising the step of creating a T2' image based on the same MR data used to create the S(0) and T2 images.

4. The method of claim 1 further comprising the step of creating tissue blood volume and blood oxygenation level images based on the same MR data used to create the S(x,y;0) and T2 images.

5. The method of claim 1 wherein the MR data is acquired with one of a two-dimensional multi-gradient echo imaging pulse sequence and a three-dimensional multi-gradient echo imaging pulse sequence.

6. The method of claim 1 wherein the step of determining a nonlinear function of gradient echo time F(TE) includes accounting for macroscopic magnetic field inhomogeneities.

7. The method of claim 1 wherein the step of determining a nonlinear function of gradient echo time F(TE) is generalized as:

$$F(TE)=1+\Sigma\alpha_m\cdot TE^{2m}$$

where m is a number in the series F(TE), $a_m$ is a phenomenological coefficient, and TE is an echo time.

8. The method of claim 7 further comprising approximating the generalized equation to one of:

$$F(TE)=1-a_1\cdot TE^2;$$

and $$F(TE)=\exp(-a\cdot TE^2)$$

where a and $a_1$ are phenomenological parameters.

9. The method of claim 7 further comprising approximating the generalized equation to:

$$F(TE) = \sin\left(\frac{\Delta\omega\cdot TE}{2}\right)/\left(\frac{\Delta\omega\cdot TE}{2}\right)$$

where $\Delta\omega$ is a frequency difference across a voxel.

10. The method of claim 7 further comprising approximating the generalized equation to:

$$F(TE)=[\sin(\gamma\cdot g_x\cdot\Delta x\cdot TE/2)/(\gamma\cdot g_x\cdot\Delta x\cdot TE/2)]\cdot[\sin(\gamma\cdot g_y\cdot\Delta y\cdot TE/2)/(\gamma\cdot g_y\cdot\Delta y\cdot TE/2)]\cdot[\sin(\gamma\cdot g_z\cdot\Delta z\cdot TE/2)/(\gamma\cdot g_z\cdot\Delta z\cdot TE/2)],$$

where macroscopic field gradients $g_x$, $g_y$, and $g_z$ are determined from phase images, and $\gamma$ is a gyromagnetic ratio constant.

11. The method of claim 1 wherein the equation that includes the nonlinear function is:

$$S(TE)=S(0) \cdot \exp(-R2 \cdot TE) \cdot F(TE)$$

where TE is a gradient echo time, S(TE) is a signal magnitude at time TE, S(0) is a signal magnitude at time zero, and R2 is the inverse of T2 relaxation time.

12. The method of claim 1 wherein the equation that includes the nonlinear function accounts for both macroscopic and mesoscopic field inhomogeneities and is given by:

$$S(TE)=S(0) \cdot \exp(-R2 \cdot TE) \cdot F(TE) \cdot F_{meso}(TE)$$

where TE is a gradient echo time, S(TE) is a signal magnitude at time TE, S(0) is a signal magnitude at time zero, R2 is the inverse of T2 relaxation time, and $F_{meso}$ is a non-linear function that accounts for mesoscopic field inhomogeneities.

13. The method of claim 1 wherein the S(x,y;0) image is one of a spin density image and a T1 weighted image.

14. An MRI apparatus to rapidly acquire T2 weighted MR images using gradient echo imaging comprising:
   a magnetic resonance imaging (MRI) system having a plurality of gradient coils positioned about a bore of a magnet to impress a polarizing magnetic field, an RF transceiver system, and an RF switch controlled by a pulse module to transmit and receive RF signals to and from an RF coil assembly to acquire MR images; and
   a computer programmed to:
      acquire multiple sets of MR data from a series of read-out gradient pulses in a pulse sequence;
      determine signal intensity for each MR data;
      fit the MR data to a signal magnitude equation that includes a nonlinear function; and
      reconstruct T2 weighted MR images that are substantially free of magnetic field inhomogeneities.

15. The MRI apparatus of claim 14 wherein the MR images reconstructed include at least one of an S(0) image, a T2 image, and a T2* image.

16. The MRI apparatus of claim 15 wherein the S(0) image is one of a spin density and a T1 weighted image.

17. The MRI apparatus of claim 15 wherein the MR data is acquired with one of a two-dimensional multi-gradient echo imaging pulse sequence and a three-dimensional multi-gradient echo imaging pulse sequence.

18. The MRI apparatus of claim 15 wherein the nonlinear function is of gradient echo time F(TE) and is generalized as:

$$F(TE)=1+\Sigma a_m \cdot TE^{2m}$$

where $a_m$ are phenomenological coefficients, and TE is a gradient echo time.

19. The MRI apparatus of claim 18 wherein the computer program approximates the generalized equation to one of:

$$F(TE)=1-a_1 \cdot TE^2;$$

and $$F(TE)=\exp(-a \cdot TE^2)$$

where a and $a_1$ are phenomenological parameters.

20. The MRI apparatus of claim 18 wherein the computer program approximates the generalized equation to:

$$F(t) = \sin\left(\frac{\Delta \omega \cdot t}{2}\right) \bigg/ \left(\frac{\Delta \omega \cdot t}{2}\right)$$

where $\Delta\omega$ is a frequency difference across a voxel.

21. The MRI apparatus of claim 18 wherein the computer program approximates the generalized equation to:

$$F(TE)=[\sin(\gamma \cdot g_x \cdot \Delta x \cdot TE/2)/(\gamma \cdot g_x \cdot \Delta x \cdot TE/2)] \cdot [\sin(\gamma \cdot g_y \cdot \Delta y \cdot TE/2)/(\gamma \cdot g_y \cdot \Delta y \cdot TE/2)] \cdot [\sin(\gamma \cdot g_z \cdot \Delta z \cdot TE/2)/(\gamma \cdot g_z \cdot \Delta z \cdot TE/2)],$$

where macroscopic field gradients $g_x$, $g_y$, and $g_z$ are determined from phase images, and $\gamma$ is a gyromagnetic ratio constant.

22. The MRI apparatus of claim 14 further comprising:
   a computer readable memory unit having stored therein a number of models for the nonlinear function;
   a user input to receive an input identifying an object scanned; and
   wherein the computer is further programmed to determine a model for the nonlinear function based on the object scanned.

23. The MRI apparatus of claim 14 wherein the MR images reconstructed are co-registered.

24. A computer program for use with an MRI apparatus comprising instructions which, when executed by a computer, cause the computer to:
   apply a pulse sequence with a train of gradient read-out pulses;
   acquire MR data during the train of gradient read-out pulses;
   depending upon identification of an object scanned, determine a nonlinear function of gradient echo time;
   fit signal magnitude of the MR data to a signal magnitude equation;
   reconstruct MR images using results of the fit wherein the MR images reconstructed can include S(0) and T2 weighted images.

25. The computer program of claim 24 wherein the S(0) image includes either one of a spin density image and a T1 weighted image based on parameters of the pulse sequence.

26. The computer program of claim 24 wherein the MR images reconstructed can also include a T2* weighted image.

27. The computer program of claim 24 wherein the MR images reconstructed can also include a T2' weighted image.

28. The computer program of claim 24 wherein the signal magnitude equation includes a nonlinear function of gradient echo time.

29. The computer program of claim 24 wherein the train of gradient read-out pulses extends to time $TE_N$, where $TE_N$ is of length sufficient to acquire T2* weighted images.

30. The computer program of claim 28 wherein the nonlinear function is selected from a number of models based on the object scanned and MR hardware characteristics.

* * * * *

UNITED STATES PATENT AND TRADEMARK OFFICE
CERTIFICATE OF CORRECTION

PATENT NO.    : 6,603,989 B1
DATED         : August 5, 2003
INVENTOR(S)   : Dmitriy A. Yablonskiy It is certified that error appears in the above-identified patent and that said Letters Patent is hereby corrected as shown below:

Title page,
Item [*] Notice, should read
-- [*] Notice:    Subject to any disclaimer, the term of this patent is extended or adjusted under 35 U.S.C. 154(b) by 365 days. --

Signed and Sealed this

Twenty-first Day of October, 2003

JAMES E. ROGAN
*Director of the United States Patent and Trademark Office*